(12) United States Patent  
Shibata et al.

(10) Patent No.: US 8,530,256 B2  
(45) Date of Patent: Sep. 10, 2013

(54) PRODUCTION PROCESS FOR SEMICONDUCTOR DEVICE

(75) Inventors: Yasuyuki Shibata, Yokohama (JP); Ji-Hao Liang, Kawasaki (JP); Takako Chinone, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 35 days.

(21) Appl. No.: 13/416,635

(22) Filed: Mar. 9, 2012

(65) Prior Publication Data

US 2012/0231608 A1 Sep. 13, 2012

(30) Foreign Application Priority Data

Mar. 11, 2011 (JP) ................................. 2011-054658

(51) Int. Cl.  
*H01L 21/205* (2006.01)  
*H01L 33/32* (2010.01)

(52) U.S. Cl.  
USPC ............. 438/46; 438/456; 438/458; 438/960; 438/977; 257/103; 257/E33.006; 257/E33.025; 257/E21.087; 257/E21.119

(58) Field of Classification Search  
USPC .................. 438/46, 456, 458, 928, 960, 977; 257/E33.006, E33.025, E21.087, E21.119  
See application file for complete search history.

(56) References Cited

U.S. PATENT DOCUMENTS

| | | | |
|---|---|---|---|
| 6,265,289 B1 * | 7/2001 | Zheleva et al. | 438/503 |
| 6,559,075 B1 | 5/2003 | Kelly et al. | |
| 6,734,503 B2 * | 5/2004 | Hata et al. | 257/352 |
| 6,790,695 B2 | 9/2004 | Ogihara et al. | |
| 7,087,930 B2 * | 8/2006 | Senda et al. | 257/79 |
| 7,445,673 B2 * | 11/2008 | Beaumont et al. | 117/94 |
| 7,588,998 B2 | 9/2009 | Fehrer et al. | |
| 7,713,840 B2 | 5/2010 | Kelly et al. | |
| 7,745,843 B2 * | 6/2010 | Baba et al. | 257/98 |
| 7,829,913 B2 * | 11/2010 | Shibata et al. | 257/103 |
| 7,981,713 B2 * | 7/2011 | Shibata | 438/47 |
| 8,118,934 B2 * | 2/2012 | Wang | 117/94 |
| 8,236,672 B2 * | 8/2012 | Chinone et al. | 438/481 |
| 2008/0149916 A1 * | 6/2008 | Baba et al. | 257/13 |
| 2009/0079035 A1 * | 3/2009 | Wang | 257/615 |
| 2009/0311847 A1 | 12/2009 | Fehrer et al. | |

(Continued)

FOREIGN PATENT DOCUMENTS

| | | |
|---|---|---|
| JP | 2000-228539 A | 8/2000 |
| JP | 2004-172351 A | 6/2004 |

(Continued)

*Primary Examiner* — Mary Wilczewski  
(74) *Attorney, Agent, or Firm* — Holtz, Holtz, Goodman & Chick, PC

(57) ABSTRACT

(a) Forming on a growth substrate a void-containing layer that is made of a group III nitride compound semiconductor and contains voids. (b) Forming on the void-containing layer an n-type layer that is made of an n-type group III nitride compound semiconductor and serves to close the voids. (c) Forming on the n-type layer an active layer made of a group III nitride compound semiconductor. (d) Forming on the active layer a p-type layer made of a p-type group III nitride compound semiconductor. (e) Bonding a support substrate above the p-type layer. (f) Peeling off the growth substrate at the boundary where the void are produced. (g) Planarizing the n-type layer. Step (b) comprises (b1) forming part of the n-type layer under conditions where horizontal growth is relatively weak and (b2) forming the remaining part of the n-type layer under conditions where horizontal growth is relatively strong.

4 Claims, 5 Drawing Sheets

(56) References Cited

U.S. PATENT DOCUMENTS

| | | |
|---|---|---|
| 2010/0155740 A1 | 6/2010 | Chinone et al. |
| 2011/0156047 A1* | 6/2011 | Tsay et al. .................. 257/76 |
| 2012/0040484 A1 | 2/2012 | Fehrer et al. |
| 2012/0199810 A1* | 8/2012 | Lee ............................ 257/13 |
| 2012/0231568 A1* | 9/2012 | Shibata et al. ............. 438/47 |
| 2012/0231608 A1* | 9/2012 | Shibata et al. ........... 438/458 |
| 2013/0026531 A1* | 1/2013 | Seo et al. .................... 257/99 |
| 2013/0037857 A1* | 2/2013 | Von Kanel et al. ....... 257/190 |
| 2013/0140517 A1* | 6/2013 | Tang et al. ................... 257/9 |

FOREIGN PATENT DOCUMENTS

| | | |
|---|---|---|
| JP | 2005-516415 A | 6/2005 |
| JP | 2007-266472 | * 10/2007 |
| JP | 2010-153450 A | 7/2010 |
| JP | 2011-192899 | * 9/2011 |
| JP | 2012-9483 | * 1/2012 |
| JP | 2012-191066 | * 10/2012 |
| JP | 2012-191067 | * 10/2012 |
| WO | WO 98-14986 A1 | 4/1998 |

* cited by examiner

FIG. 5

| GROWTH TEMPERATURE FOR N-TYPE LAYER | VOID | FEATURES |
|---|---|---|
| LOW TEMPERATURE | FEW | DISSIPATION IS SMALL, AND FORMATION OF SUFFICIENTLY LARGE VOIDS IS DIFFICULT |
| MEDIUM TEMPERATURE | GOOD | EVAPORATION HAS LARGE INFLUENCE AND VOIDS PERSIST |
| HIGH TEMPERATURE | FEW | HORIZONTAL GROWTH HAS LARGE INFLUENCE, AND VOIDS ARE CLOSED SO QUICKLY THAT FORMATION OF SUFFICIENTLY LARGE VOIDS IS DIFFICULT |

PRODUCTION PROCESS FOR SEMICONDUCTOR DEVICE

CROSS-REFERENCE TO RELATED APPLICATION

This application is based upon and claims the benefit of priority of the prior Japanese Patent Application No. JP 2011-054658, filed on Mar. 11, 2011, the entire contents of which are incorporated herein by reference.

BACKGROUND OF THE INVENTION

A) Field of the Invention

The present invention relates to a production process for semiconductor devices such as light emitting diode.

B) Description of the Related Art

Commonly, a light emitting diode (LED) is produced by forming on a substrate a semiconductor multilayer film (semiconductor layer) consisting of an n-type layer, active layer (light emitting layer), p-type layer, and the like, and subsequently forming electrodes on the surfaces of the substrate and the semiconductor multilayer film. In the case of using a growth substrate of an insulating material, an appropriate region of the semiconductor layer is etched by, for instance, reactive ion etching to expose part of the n-type layer, followed by forming an electrode in the n-type layer and another electrode in the p-type layer.

The selection of the material for the growth substrate can have a large influence on the crystal quality of the resulting semiconductor layer. The electric conductivity, thermal conductivity, and light absorption coefficient of the growth substrate, however, can also have an influence on the electric, thermal, and optical characteristics of the resulting light emitting diode. It cannot be expected that a growth substrate suitable for forming a semiconductor layer with good crystal characteristics always serves to produce a semiconductor device that is also good in all other characteristics. Some studies have proposed thin-film LEDs or laser diodes (LDs) that are produced by peeling off the semiconductor layer from the growth substrate and forming electrodes directly on the semiconductor layer that contributes to light emission (for instance, see Domestic re-publication of PCT international application WO98-14986 as Patent document 1, Published Japanese Translation of PCT International Publication JP 2005-516415 as Patent document 2, Japanese Unexamined Patent Publication (Kokai) No. 2000-228539 as Patent document 3, and Japanese Unexamined Patent Publication (Kokai) No. 2004-172351 as Patent document 4). The removal of the growth substrate improves electric, thermal, and optical characteristics. The laser lift-off technique is generally used for the removal of the growth substrate.

Some documents have disclosed inventions of semiconductor device production processes that comprise forming a void-containing layer on a growth substrate, growing an n-type layer, light emitting layer, and p-type layer on it, bonding a support substrate, and then applying an impact to the void-containing layer to peel off the growth substrate (for instance, see Japanese Unexamined Patent Publication (Kokai) No. 2010-153450 as Patent document 5). For the invention described in Patent document 5, a void-containing layer is formed by alternately performing a step for preferred growth in the horizontal direction (in-plane direction of the layer) and a step for preferred growth in the vertical direction (thickness direction of the layer). The openings in the void-containing layer are closed by an n-type layer formed on the void-containing layer.

The semiconductor device production process proposed in Patent document 5 sometimes suffers from a problem as described below.

FIGS. 4A to 4C are cross sections containing a void-containing layer. The problem with the conventional processes is described below with reference to FIGS. 4A to 4C.

Refer to FIG. 4A. A void-containing layer 51 of GaN is located on a growth substrate 50. A material gas G is being supplied to form an n-type layer 52, which is an n-type GaN film, on the void-containing layer 51. Voids 53 are being generated in the void-containing layer 51 and in the n-type layer 52 that is being formed. In the case of FIG. 4A, the voids 53 have large openings R. The voids 53 are being closed as the n-type layer 52 grows in the horizontal direction. At the same time, nitrogen gas ($N_2$) resulting from the decomposition of the semiconductor and the GaN crystals 54 in the voids 53 gets out of the voids 53 through the openings R. When the openings R are large, this $N_2$ gas will not significantly prevent the material gas G from reaching the edge portions of the openings R and have no significant influence on the horizontal growth of the n-type layer 52.

Refer to FIG. 4B. FIG. 4B illustrates a later state of the n-type layer 52 formation following the state in FIG. 4A. The voids 53 are closed gradually as the n-type layer 52 grows. In FIG. 4B, the voids 53 are being closed gradually and the openings R are becoming smaller. As the openings R become smaller, the $N_2$ gas gets out more rapidly from inside the voids 53, preventing the material gas G from reaching the edge portions of the openings R and inhibiting the n-type layer 52 from growing horizontally and closing the voids 53.

FIG. 4C is a cross section illustrating the shape of the voids 53 which are closed as a result of the growth of the n-type layer 52. In this figure, $V_1$ denotes void portions formed when the openings R are large whereas $V_2$ denotes void portions formed when the openings R are small. When the openings R are small to impede the horizontal growth of the n-type layer 52 during its formation, the voids 53 takes much time to close, causing the height the void portions $V_2$, and in turn, that of the voids 53, to increase.

For the invention proposed in the Patent document 5, the n-type layer 52, light emitting layer, and p-type layer are formed, and then the growth substrate 50 is peeled off, followed by polishing those portions of the void-containing layer 51 and the n-type layer 52 that contain the voids 53, thus planarizing the n-type layer 52. In this step, the polishing operation takes much time if the voids 53 are large in height. Furthermore, the portions to be polished in the n-type layer 52 are thicker, and accordingly the formation of the n-type layer 52 needs a longer period of time. A likely solution to the problem is optimizing the growth temperature for the n-type layer 52 to appropriately control the speed of closure of the openings.

FIG. 5 gives a table that summarizes the relations between the growth temperature for the n-type layer 52 and the size of the voids 53. The test was performed at three growth temperatures: 980° C. as low temperature, 1,000° C. as medium temperature, and 1,020° C. as high temperature. When the n-type layer 52 is grown at the medium temperature, the evaporation (decomposition, dissipation) of GaN crystals has a large influence as described above and the voids 53 do not close quickly, causing the n-type layer 52 formation step and the subsequent polishing step to require a long period of time. From the viewpoint of the peeling of the growth substrate 50, however, it can be said that the voids 53 are formed appropriately.

When the n-type layer 52 is grown at the low temperature, for instance, the constituent elements of the void-containing layer 51 do not decompose and dissipate adequately, making it difficult for the voids 53 to grow to a sufficiently large size. This is because the decomposition and dissipation of GaN are necessary for the formation of the voids 53 even during the growth of the n-type layer 52. Thus, the number of the voids 53 formed is small and accordingly the growth substrate 50 may not be peeled smoothly.

Horizontal growth can be promoted if the n-type layer 52 is grown at a high temperature. However, for the voids 53 to become large, the dissipation needs to continue in it during the growth of the n-type layer 52. In the above case, the horizontal growth is promoted and accordingly, the voids 53 are closed so early that the subsequent dissipation is depressed, making it difficult for the voids 53 to become large enough. This, in turn, makes it difficult to achieve a sufficient surface area occupancy on the growth substrate 50 (ratio of the area where the void-containing layer 51 is in contact with the growth substrate 50) required for the peeling of the growth substrate 50 (accordingly, the growth substrate 50 will not be peeled smoothly).

Thus, conventionally, it has been difficult to maintain the height of the voids 53 at a low level while growing the voids 53 to a desired size at an optimized growth temperature for the n-type layer 52.

Here, likely means of maintaining the voids 53 at a small opening ratio (the ratio of the size of the openings R at the top of the voids 53 to the total area of the layer) during the formation of the void-containing layer 51 include, for instance, increasing the thickness of the void-containing layer 51 and increasing the growth temperature during the formation of the void-containing layer 51. The former method is not preferred because the void-containing layer 51 will require a long growth time, accordingly leading to an increased height of the voids 53. With the latter method, not only the opening ratio but also the size of the voids 53 themselves will be small, making it difficult to achieve a sufficient surface area occupancy required for peeling. Thus, conventionally, it has been difficult to maintain the opening ratio at, for instance, about 50% or less while enlarging the voids 53 to an appropriate size.

SUMMARY OF THE INVENTION

The invention aims to provide a semiconductor device production process that can produce semiconductor devices in a short period of time.

An aspect of the present invention provides a semiconductor device production process comprising: (a) forming on a growth substrate a void-containing layer that is made of a group III nitride compound semiconductor and contains voids, (b) forming on the void-containing layer an n-type layer that is made of an n-type group III nitride compound semiconductor and serves to close the voids, (c) forming on the n-type layer an active layer made of a group III nitride compound semiconductor, (d) forming on the active layer a p-type layer made of a p-type group III nitride compound semiconductor, (e) bonding a support substrate above the p-type layer, (f) peeling off the growth substrate at the boundary where the void are produced, and (g) planarizing the n-type layer, wherein (b) comprises (b1) forming part of the n-type layer under conditions where horizontal growth is relatively weak and (b2) forming the remaining part of the n-type layer under conditions where horizontal growth is relatively strong.

The invention can provide a semiconductor device production process that can produce semiconductor devices in a short period of time.

BRIEF DESCRIPTION OF THE DRAWINGS

FIG. 5 gives a table that summarizes the relations between the growth temperature for the n-type layer 52 and the size of the voids 53.

DESCRIPTION OF THE PREFERRED EMBODIMENTS

The embodiment of the invention is described below with reference to drawings. The invention relates to a production process for semiconductor devices, but a production process for a light emitting diode is illustrated below as an example.

Figure 1:
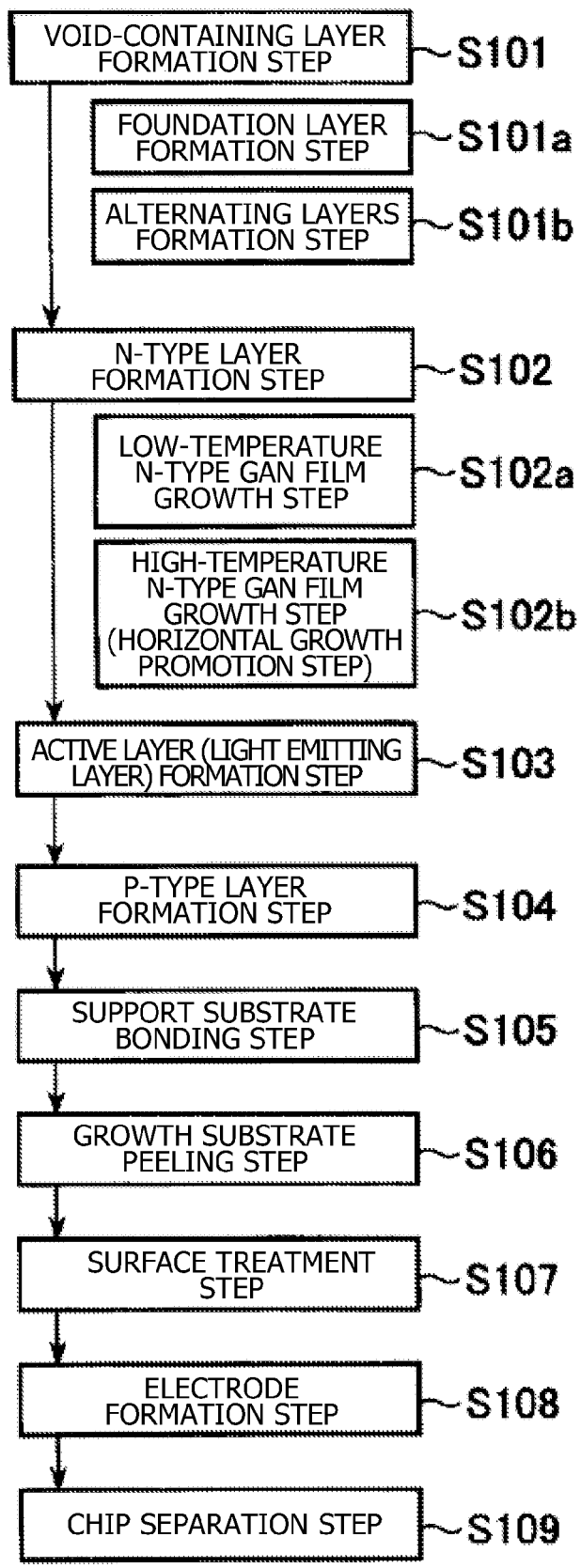
FIG. 1 gives a flow chart schematically illustrating the semiconductor device production process according to an embodiment of the invention.

FIG. 1 gives a flow chart schematically illustrating the semiconductor device production process according to the embodiment of the invention. In the semiconductor device production process according to the embodiment, a void-containing layer that is made of a group III nitride compound semiconductor (group III-V nitride compound semiconductor) and contains many voids inside is formed first on the growth substrate in step S101. The void-containing layer formation step (step S101) comprises forming a foundation layer (step S101a) and forming an alternating layers (step S101b).

Then, an epitaxial layer of a group III nitride compound semiconductor is formed on the void-containing layer by, for instance, the MOCVD method. The epitaxial group III nitride compound semiconductor layer comprises an n-type layer (n-type semiconductor layer), an active layer (light emitting layer), and a p-type layer (p-type semiconductor layer). The n-type layer, active layer (light emitting layer), and p-type layer are formed of a group III nitride compound semiconductor such as GaN semiconductor.

Then the epitaxial group III nitride compound semiconductor layer formation step, an n-type layer comprising, for instance, n-type GaN is formed first on the void-containing layer (step S102). The n-type layer formation step, i.e. step S102, comprises growing a low-temperature n-type GaN film (step S102a) and growing a high-temperature n-type GaN film (horizontal growth promotion step) (step S102b). Subsequently, an active layer (light emitting layer) that emits light when electrified is formed on the n-type layer (step S103). Furthermore, a p-type layer of a p-type GaN semiconductor is formed on the active layer (light emitting layer) (step S104).

In step S105, a support substrate is bonded above the epitaxial semiconductor layer (p-type layer). Then, in step S106, the growth substrate is peeled off from the epitaxial semiconductor layer (n-type layer, active layer, and p-type layer) at the boundary where the voids are produced. For the surface treatment in step S107, the surface of the epitaxial semiconductor layer (n-type layer) exposed by peeling off the growth substrate is planarized by, for instance, polishing. In step S108, an electrode is formed on the surface-treated epitaxial semiconductor layer (n-type layer). Subsequently, the epitaxial semiconductor layer together with the support substrate is divided into chips (step S109).

FIGS. 2A to 2F and FIGS. 3A to 3F are cross sections illustrating the semiconductor device production process according to the embodiment.

Figure 2A:
FIGS. 2A to 2F are cross sections illustrating the semiconductor device production process according to the embodiment.

The void-containing layer formation step (step S101) is described below with reference to FIG. 2A to 2D. FIG. 2A schematically illustrates the foundation layer formation step, i.e. step S101a. For instance, a growth substrate 10, which may be a sapphire substrate with a diameter of 2 in. and a thickness of 430 μm, is put on a susceptor and placed in a MOCVD apparatus. In an atmosphere of 13.5 LM of nitrogen and 4.5 LM of hydrogen, trimethyl gallium (TMG) and ammonia ($NH_3$) are supplied at a flow rate of 11 μmol/min and 3.3 LM, respectively, to form a foundation layer 11a of GaN with a thickness of 200 nm at 500° C. After forming the foundation layer 11a, the supply of TMG is stopped and the ambient temperature is increased to 1,000° C. Here, the temperature of 1000° C. is suitable for growing an GaN film in the low-temperature n-type GaN film growth step (step S102a).

Figure 2B:

Refer to FIG. 2B. In the alternating layer formation step, i.e. step S101b, an alternating layer 11b of GaN is formed on the foundation layer 11a in an atmosphere of 6 LM of nitrogen and 7.5 LM of hydrogen while maintaining the ambient temperature at 1,000° C. The alternating layer 11b is formed by producing two or more sets, for instance, four sets, of a combination of a first step layer $11b_1$ and a second step layer $11b_2$. The first step layer $11b_1$ is formed under conditions where vertical growth is mainly promoted while the second step layer $11b_2$ is formed under conditions where horizontal growth is mainly promoted.

As illustrated in FIG. 2B, $NH_3$ is supplied at a flow rate of 2.2 LM while supplying TMG at a flow rate of 23 μmol/min to form a first step layer $11b_1$, which is a GaN-type layer with a thickness of 20 nm, on the foundation layer 11a.

Figure 2C:

Refer to FIG. 2C. $NH_3$ is supplied at a flow rate of 4.4 LM while supplying TMG at a flow rate of 45 μmol/min to form a second step layer $11b_2$, which is a GaN-type layer with a thickness of 80 nm, on the first step layer $11b_1$.

Figure 2D:
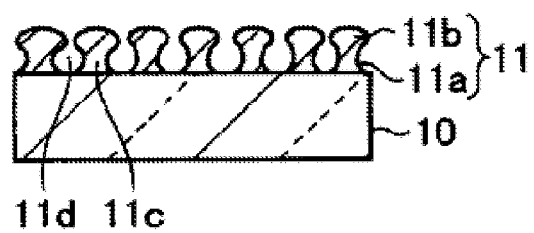

Refer to FIG. 2D. The combination of a first step layer $11b_1$ with a thickness of 20 nm and a second step layer $11b_2$ with a thickness of 80 nm is grown four times repeatedly to produce an alternating layer 11b of GaN with a thickness of 400 nm. The layer constituted of the foundation layer 11a and the alternating layer 11b is referred to as the void-containing layer 11. The void-containing layer 11 comprises columnar structures 11c, each consisting of the foundation layer 11a and the alternating layer 11b, and voids 11d located between the columnar structures 11c. The opening ratio measured after the formation of the void-containing layer 11 (after the formation of the alternating layer 11b) was 62%. The opening ratio depending on the film formation conditions, and it is preferable for the invention that the conditions are such that it is 50% or more after the formation of the void-containing layer 11 in order to prevent the void-containing layer 11 from becoming too thick while maintaining the voids large enough for peeling.

Thus, the first step layer $11b_1$ and the second step layer $11b_2$ are formed alternately and repeatedly under different growth conditions so that an epitaxial semiconductor layer (n-type layer, active layer, and p-type layer) having a high surface smoothness and high crystallinity will be finally produced while leaving contact portions, which act as nuclei of the crystals, and noncontact portions, which are fused together while growing in the horizontal direction.

The n-type layer formation step (step S102) is described below with reference to FIGS. 2E and 2F. In the n-type layer formation step, an n-type GaN film (n-type layer 12) is formed on the void-containing layer 11 to close the voids 11d.

First, for instance, an n-type GaN film with a thickness of 1 μm is formed on the void-containing layer 11 in the low-temperature n-type GaN film growth step (step S102a) at a relatively low temperature of 995° C. to 1,005° C. (the ambient temperature is 1,000° C. in the embodiment). During the film production, for instance, TMG was supplied at a flow rate of 45 μmol/min, $NH_3$ supplied at a flow rate 5.5 LM, and $SiH_4$ supplied as dopant gas at 86.6 ccm.

Figure 2E:
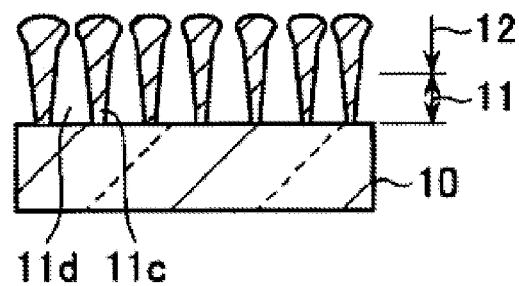

FIG. 2E is a cross section after low-temperature n-type GaN film formation. In the low-temperature n-type GaN film growth step, an n-type GaN film is formed under conditions where horizontal growth is relatively weak to reduce the opening ratio of the voids 11d while allowing the GaN crystals in the voids 11d to decompose and dissipate adequately so that the voids 11d formed will be large enough for smooth peeling of the growth substrate 10 in the subsequent growth substrate peeling step (step S106). The opening ratio measured after the formation of the low-temperature n-type GaN film was 19%.

In step S102a, however, although the horizontal growth is weak as compared with the following step S102b, it is preferable that the horizontal growth predominates as compared with the formation of the second step layer $11b_2$ in the void-containing layer formation step because it is necessary to reduce the opening ratio.

Figure 2F:
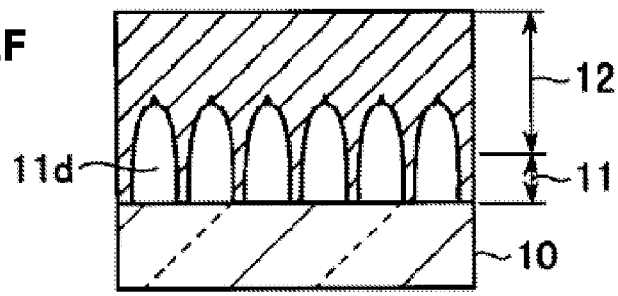

Refer to FIG. 2F. After growing the n-type GaN film at a relatively low temperature, the growth temperature for the n-type GaN film is raised in the high-temperature n-type GaN film growth step (horizontal growth promotion step) (step S102b) while maintaining the supply of the material gas. In step S102b, for instance, an n-type GaN film with a thickness of 5 μm is formed at a relatively high temperature of 1,010° C. to 1,030° C. (the ambient temperature is 1,020° C. in the embodiment). The material gas used and its supply rate are the same as for the low-temperature n-type GaN film growth in step S102a.

FIG. 2F is a cross section after high-temperature n-type GaN film formation. In the high-temperature n-type GaN film growth step (horizontal growth promotion step), an n-type GaN film is formed under conditions where the horizontal growth is strong so that the n-type GaN film formed acts to close the voids 11d.

In the semiconductor device production process according to the embodiment, the combination of the low-temperature n-type GaN film growth step (step S102a) and the high-temperature n-type GaN film growth step (step S102b) serves to form an n-type GaN film (n-type layer 12) that closes the voids 11d. In the low-temperature n-type GaN film growth step where the voids 11d begins to be closed, an n-type GaN film is formed under conditions where the horizontal growth is relatively weak, allowing the voids 11d to become adequately large.

In the high-temperature n-type GaN film growth step (horizontal growth promotion step), an n-type GaN film is formed under conditions where the horizontal growth is relatively strong. Since the horizontal growth predominates, the openings can be closed at an early stage even if gas gets out rapidly through the openings of the voids 11d. This serves to prevent an increase in the height of the voids 11d and the thickness of the n-type layer 12. Consequently, not only the time for the n-type layer formation step (step S102) but also the time for, for instance, the surface treatment step (step S107) where the n-type layer 12 is planarized by polishing can be shortened.

The n-type GaN film formed in the low-temperature n-type GaN film growth step according to the embodiment has a thickness of 1 μm (a thickness that leads to an opening ratio of the voids 11d of 19%), but the invention should not be construed as being limited thereto. An n-type GaN film may be grown under conditions where the horizontal growth is relatively weak until the opening ratio increases to a value in the range of 5% or more and 40% or less, followed by altering the growth conditions. If the alteration of growth conditions is delayed until the opening ratio becomes less than 5%, the height of the voids 11d will become too large to achieve sufficient effect. If the shift to the high-temperature n-type GaN film growth step (horizontal growth promotion step) is started when the opening ratio is above 40%, the voids 11d may fail to become adequately large. The above-mentioned effect can be achieved adequately in the case where the growth conditions are altered when the opening ratio has decreased to a value in the range of 5% to 40%. If the high-temperature n-type GaN film growth step alone is performed without carrying out the low-temperature n-type GaN film growth step, the openings will be closed before the voids 11d reach an adequate size, possibly making it difficult for the growth substrate 10 to be peeled smoothly in the growth substrate peeling step (step S106).

Furthermore, the n-type GaN film formed in the high-temperature n-type GaN film growth step (horizontal growth promotion step) according to the embodiment has a thickness of 5 μm, but the invention should not be construed as being limited to this film thickness. Note that it is only necessary for the growth of the n-type GaN film to be continued at, for instance, 1,010° C. to 1,030° C. until the opening ratio of the voids 11d reaches 0%, and the growth temperature may be raised or lowered after the opening ratio has reached 0%. According to the embodiment, furthermore, the horizontal growth is promoted by raising the growth temperature, but the horizontal growth may be accelerated by, for instance, increasing the $NH_3$ supply rate. In this case, the horizontal growth promotion in step S102b may be achieved by forming an n-type GaN film under the conditions of, for instance, a growth temperature of 1,000° C., TMG flow rate of 45 μmol/min, $NH_3$ flow rate of 6.5 LM, and $SiH_4$ dopant gas supply quantity of 86.6 ccm.

Figure 3A:
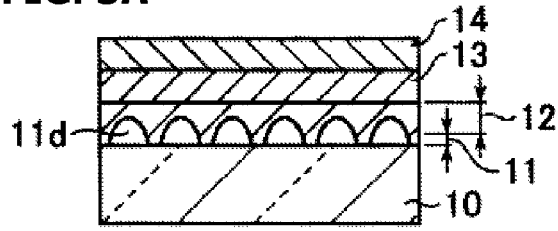
FIGS. 3A to 3F are cross sections illustrating the semiconductor device production process according to the embodiment.

Refer to FIG. 3A. After the n-type layer formation step (step S102), the active layer (light emitting layer) formation step (step S103) is carried out to form an active layer (light emitting layer) 13 on the n-type layer 12.

In the active layer (light emitting layer) formation step, 30 pairs of GaN and $In_yGaN$ (each 2 nm) are formed first at an ambient temperature of 760° C. under the conditions of a TMG flow rate of 3.6 μmol/min, trimethyl indium (TMI) flow rate of 3.6 μmol/min, and $NH_3$ flow rate of 4.4 LM to produce a strain relaxation layer (not included in the figures). Here, the TMG and TMI flow rates may be changed in the range of 1 μmol/min to 10 μmol/min. In this case, the flow rates of TMI and TMG are changed simultaneously to adjust the In content to about 20%. The flow rate of $NH_3$ may be changed in the range of 3.3 LM to 5.5 LM. Furthermore, $In_xGaN$ may be formed instead of GaN. In this case, the flow rate is adjusted to meet the equation of x<y. Furthermore, the thickness of the strain relaxation layer may be changed in the range of 50 nm to 300 nm by changing the thickness of the GaN and $In_yGaN$ layers or the number of the pairs. The strain relaxation layer may be doped with Si up to a maximum of $5E17$ atoms/cm².

Subsequently, five pairs of a GaN barrier layer and an $In_yGaN$ well layer (14 nm and 2 nm, respectively) are formed at an ambient temperature of 730° C. under the conditions of a TMG flow rate of 3.6 μmol/min, TMI flow rate of 10 μmol/min, and $NH_3$ flow rate of 4.4 LM to produce an active layer (light emitting layer) 13 having a multiple quantum well structure. Here, the TMG and TMI flow rates may be changed in the range of 1 μmol/min to 10 μmol/min. In this case, the flow rates of TMI and TMG are changed simultaneously to adjust the value of y, which denotes the composition ratio of In, to about 0.35. The flow rate of $NH_3$ may be changed in the range of 3.3 LM to 5.5 LM. Furthermore, the active layer (light emitting layer) 13 may be doped with Si up to a maximum of $5E17$ atoms/cm².

Subsequently, the p-type layer formation step (step S104) is carried out to form a p-type layer 14 on the active layer (light emitting layer) 13.

In the p-type layer formation step, a p-type AlGaN layer with a thickness of about 40 nm doped with $1E20$ atoms/cm² of Mg (not included in the figures) is formed at an ambient temperature of 870° C. under the conditions of a TMG flow rate of 8.1 μmol/min, trimethyl aluminum (TMA) flow rate of 7.6 μmol/min, and $NH_3$ flow rate of 4.4 LM while also supplying CP2Mg (bis-cyclopentadienyl Mg) as dopant gas. The TMG flow rate may be changed in the range of 4 μmol/min to 20 μmol/min. In this case, the flow rates of TMG and TMA are changed simultaneously to adjust the Al content to about 20%. The flow rate of $NH_3$ may be changed in the range of 3.3 LM to 5.5 LM. Furthermore, the thickness of the p-type AlGaN layer may be changed in the range of 20 nm to 60 nm.

Then, a p-type layer 14 with a thickness of about 200 nm doped with $1E20$ atoms/cm² of Mg is formed at an ambient temperature of 870° C. under the conditions of a TMG flow rate of 18 μmol/min and a $NH_3$ flow rate of 4.4 LM while also supplying CP2Mg as dopant gas. The TMG flow rate may be changed in the range of 8 μmol/min to 36 μmol/min. The flow rate of $NH_3$ may be changed in the range of 3.3 LM to 5.5 LM. Furthermore, the thickness of the p-type layer 14 may be changed in the range of 100 nm to 300 nm.

The p-type layer 14 is activated by carrying out heat treatment in a nitrogen atmosphere at about 900° C. for about 1 minute.

The support substrate bonding step (step S105) is described below with reference to FIGS. 3B and 3C.

Figure 3B:
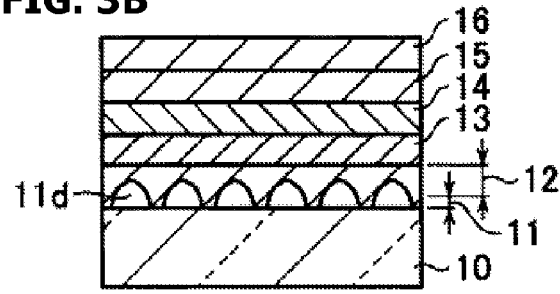

Refer to FIG. 3B. A Pt layer (10 Å) and an Ag layer (3,000 Å) are deposited in this order on the p-type layer 14 by, for instance, vacuum deposition to form an electrode layer 15. The Pt layer serves to maintain ohmic contact with the p-type layer 14 and the Ag layer acts to maintain high reflectance. Subsequently, a Ti layer (1,000 Å), Pt layer (2,000 Å) and Au layer (2,000 Å) are deposited in this order to form a bonding layer 16 on the electrode layer 15. The bonding layer 16 constitutes a bonding portion for bonding to the support substrate 20 as described later.

Figure 3C:
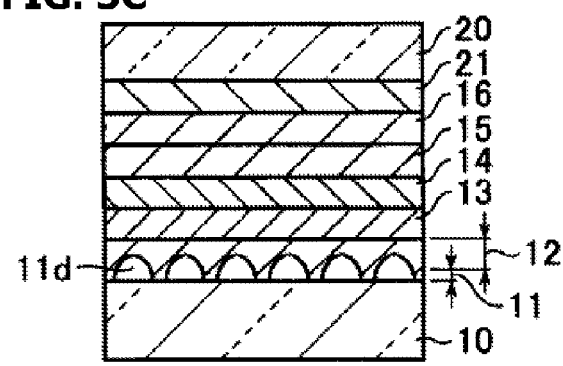

Refer to FIG. 3C. A support substrate 20 is prepared to replace the growth substrate 10 to support the epitaxial semiconductor layer (n-type layer 12, active layer 13, and p-type layer 14). For instance, a Si single crystal substrate may be used as the support substrate 20. A bonding layer 21 consisting of a Pt layer, Ti layer, Ni layer, Au layer, and AuSn layer deposited in this order is formed on the support substrate 20 by, for instance, vacuum deposition. Subsequently, the bonding layer 21 and the bonding layer 16 are brought into close contact and the support substrate 20 is bonded to the surface of the p-type layer 14 in the epitaxial semiconductor layer by thermocompression bonding in a vacuum or nitrogen atmosphere. Here, the support substrate 20 may be formed by plating the bonding layer 21 with metal such as Cu.

Figure 3E:
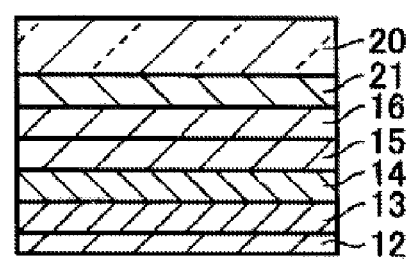
Figure 3D:
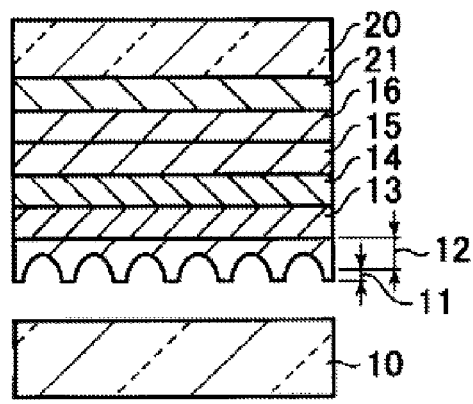

Refer to FIG. 3D. In the growth substrate peeling step (step S106), the growth substrate 10 is removed from the epitaxial semiconductor layer (active layer 13) at the boundary where the voids 11d have been formed. The growth substrate 10 is joined with the epitaxial semiconductor layer (n-type layer 12) by the columnar structures 11c of a width of several micrometers, which are distributed nearly uniformly within the void-containing layer 11, located between them, and therefore, by applying a slight external force to this bonding portion, the growth substrate 10 can be peeled easily from, for instance, the void-containing layer 11 as starting point. As an example, the peeling can be achieved by applying a small impact to the growth substrate 10. Peeling of the growth substrate 10 can also be achieved by applying vibrations to the wafer using, for instance, ultrasonic waves. Furthermore, peeling of the growth substrate 10 can also be achieved by infiltrating a liquid in the voids 11d in the void-containing layer 11 and heating it to cause a vapor pressure. In addition, peeling of the growth substrate 10 can be achieved by immersing the wafer in an acid or alkali solution to infiltrate an etchant in the voids 11d, followed by etching the columnar structures 11c. Furthermore, the LLO method may be used supplementarily for the peeling of the growth substrate 10.

Practically no problems will take place if at the boundary where the voids 11d have been formed, the growth substrate 10 is peeled off naturally before the completion of the support substrate bonding step (step S105) due to, for instance, the stress in the support substrate 20. Therefore, the growth substrate peeling step (step S106) can be omitted if the mechanical strength of the void-containing layer 11 is adjusted so that natural peeling is caused by the stress in the support substrate 20 after the completion of the support substrate bonding step.

The surface treatment step (step S107) is described below with reference to FIG. 3E. In the surface treatment step, the surface exposed by peeling the growth substrate 10 is treated with hydrochloric acid to remove the metal Ga adhered on the void-containing layer 11, and the surface of the n-type layer 12 is exposed and polished to planarize the n-type layer 12 to a predetermined thickness. In the case where the wafer is immersed in an acid or alkali to infiltrate an etchant in the voids 11d in the growth substrate peeling step, metal Ga is mostly removed then, but if there is a residue, it is removed in this step. The etchant may not necessarily be hydrochloric acid, but others such as, for instance, phosphoric acid, sulfuric acid, KOH, and NaOH may be used as long as they can serve for etching the GaN film. If, for instance, KOH is used as the etchant, many projections in the form of six-sided pyramids, originating in GaN crystal and called microcones, are formed on the surface of the n-type layer 12 to contribute to improvement in the light extraction efficiency. Instead of wet etching, the surface treatment may be carried out by dry etching using Ar plasma or chlorine plasma.

Figure 3F:
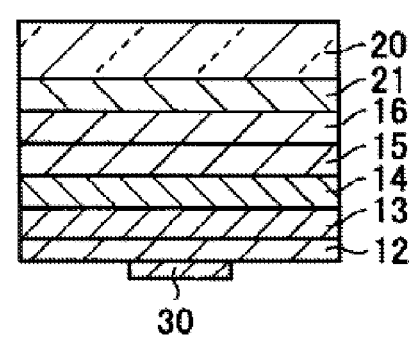
Figure 4A:
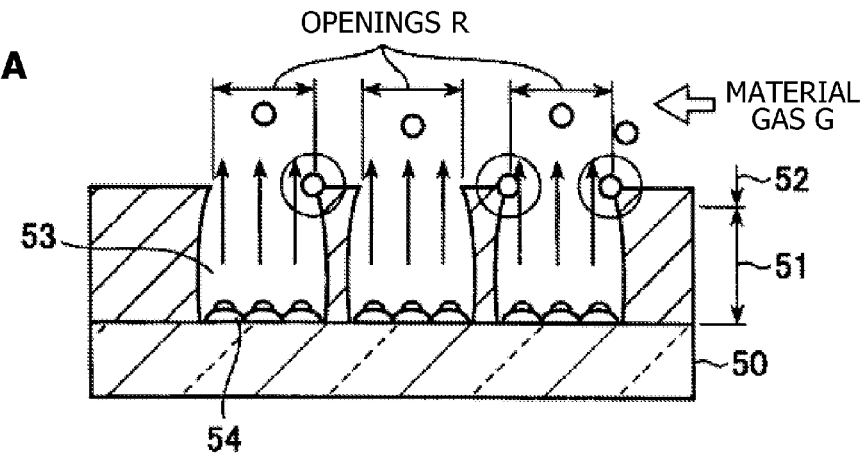
FIGS. 4A to 4C are cross sections containing the void-containing layer.
Figure 4B:
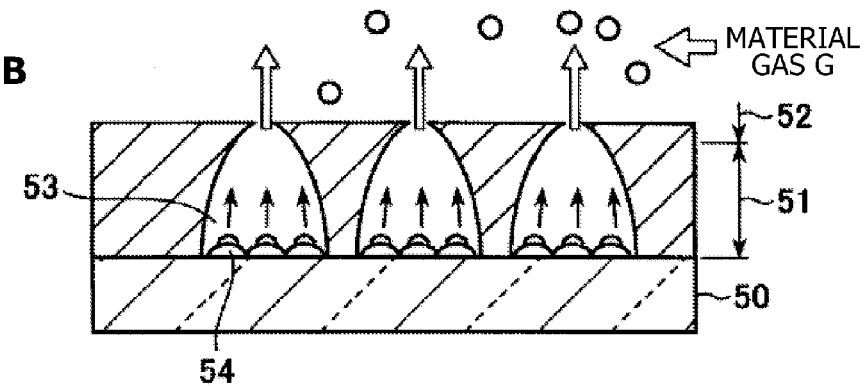
Figure 4C:
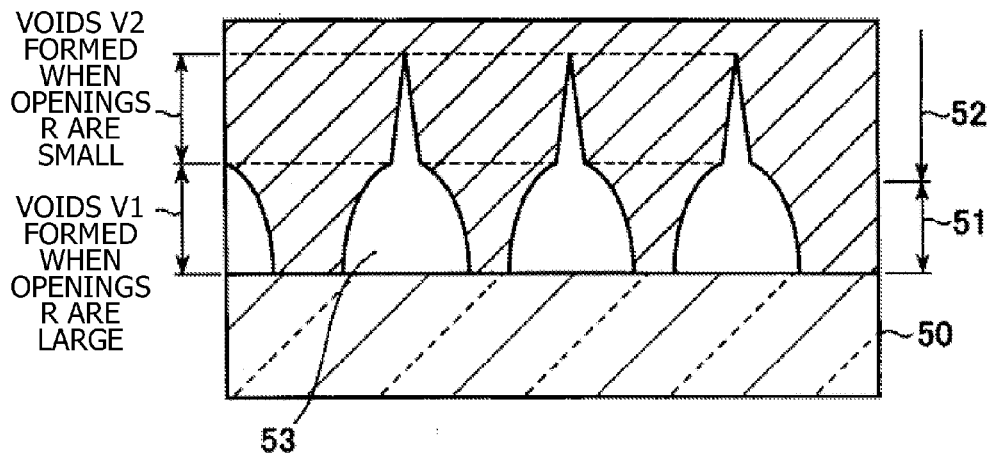

The electrode formation step (step S108) is described below with reference to FIG. 3F. A Ti layer and an Al layer are deposited in this order on the treated surface of the n-type layer 12 by, for instance, vacuum deposition, and for further improving the bonding, a Ti layer/Au layer is deposited on the outermost face to produce an n-type electrode 30. The electrode material may be, for instance, Al layer/Rh layer, Al layer/Ir layer, Al layer/Pt layer, or Al layer/Pd layer, instead of Ti layer/Al layer.

The electrode formation step is followed by a chip separation step (step S109). In the chip separation step, the epitaxial semiconductor layer combined with the support substrate 20 and the n-type electrode 30 formed on it is separated into individual chips. In this step, the epitaxial semiconductor layer surface is patterned first using a resist to form grooves between chips. Then, reactive ion etching is carried out so that the grooves on the surface of the epitaxial semiconductor layer are deepened to reach the electrode layer 15. Subsequently, the support substrate 20 and other layers are diced into chips. Other techniques such as laser scribing may be used instead. Thus, a semiconductor device is produced by carrying out the steps described above.

The semiconductor device production process according to the embodiment is characterized in that the n-type layer formation step (step S102) comprises a low-temperature n-type GaN film growth step (step S102a) and a high-temperature n-type GaN film growth step (step S102b). The semiconductor device production process according to the embodiment serves to form the voids 11d to an appropriate size suitable for smooth peeling of the growth substrate 10, while controlling their height. It is possible to prevent an increase in the height of the voids 11d and the thickness of the n-type layer 12, serving to shorten the time required for the n-type layer formation step (step S102) and the surface treatment step (step S107), and consequently the total time for semiconductor device production.

Thus, the present invention has been described above based on an embodiment thereof, but the invention should not be construed as being limited thereto. Various modifications, alterations, and combinations will become apparent to those skilled in the art.

The process can be applied effectively to the production of general semiconductor devices including light emitting diodes.

What is claimed is:

1. A semiconductor device production process comprising:
(a) forming on a growth substrate a void-containing layer that is made of a group III nitride compound semiconductor and contains voids,
(b) forming on the void-containing layer an n-type layer that is made of an n-type group III nitride compound semiconductor and serves to close the voids,
(c) forming on the n-type layer an active layer made of a group III nitride compound semiconductor,
(d) forming on the active layer a p-type layer made of a p-type group III nitride compound semiconductor,
(e) bonding a support substrate above the p-type layer,
(f) peeling off the growth substrate at the boundary where the void are produced, and
(g) planarizing the n-type layer, wherein
(b) above comprises
(b1) forming part of the n-type layer under conditions where horizontal growth is relatively weak, and
(b2) forming the remaining part of the n-type layer under conditions where horizontal growth is relatively strong.

2. A semiconductor device production process as claimed in claim 1 wherein the shift from (b1) to (b2) takes place when the opening ratio of the voids has reached a value in the range of 5% to 40%.

3. A semiconductor device production process as claimed in claim 1 wherein the temperature for forming an n-type layer in (b2) is higher than the temperature for forming an n-type layer in (b1).

4. A semiconductor device production process as claimed in claim 3 wherein in (b1), an n-type layer is formed in the temperature range of 995° C. to 1,005° C. while in (b2), an n-type layer is formed in the temperature range of 1,010° C. to 1,030° C.

* * * * *